United States Patent
Qin et al.

(10) Patent No.: US 11,366,166 B2
(45) Date of Patent: Jun. 21, 2022

(54) METHOD AND APPARATUS FOR DISPLAYING INFORMATION OF MOTOR, AND COMPUTER DEVICE

(71) Applicant: AAC Technologies Pte. Ltd., Singapore (SG)

(72) Inventors: Yingming Qin, Shenzhen (CN); Yajun Zheng, Shenzhen (CN); Xiaojie Shao, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 176 days.

(21) Appl. No.: 16/995,720

(22) Filed: Aug. 17, 2020

(65) Prior Publication Data

US 2021/0018565 A1 Jan. 21, 2021

Related U.S. Application Data

(63) Continuation of application No. PCT/CN2019/094088, filed on Jun. 30, 2019.

(51) Int. Cl.
| | |
|---|---|
| *G01R 31/34* | (2020.01) |
| *G01H 11/06* | (2006.01) |
| *G01R 19/165* | (2006.01) |
| *G07C 3/00* | (2006.01) |

(52) U.S. Cl.
CPC .......... *G01R 31/343* (2013.01); *G01H 11/06* (2013.01); *G01R 19/16533* (2013.01); *G01R 19/16571* (2013.01); *G07C 3/00* (2013.01)

(58) Field of Classification Search
CPC ........ G01R 19/16533; G01R 19/16571; G01R 31/343; G01H 1/003; G01H 11/06; G07C 3/00; G07C 3/12
See application file for complete search history.

(56) References Cited

U.S. PATENT DOCUMENTS

| | | | | |
|---|---|---|---|---|
| 2004/0199416 | A1* | 10/2004 | Heina | G06Q 10/06 |
| | | | | 702/182 |
| 2010/0250169 | A1* | 9/2010 | Goodman | B64F 5/60 |
| | | | | 702/77 |

* cited by examiner

*Primary Examiner* — Terrell S Johnson
(74) *Attorney, Agent, or Firm* — W&G Law Group

(57) ABSTRACT

A method and an apparatus for displaying information of a motor are provided. The method includes: acquiring a target category identifier of a target motor; determining a category parameter interface according to the target category identifier, and displaying the category parameter interface, wherein the category parameter interface displays a category parameter tag that prompts a user to enter parameter information corresponding to the category parameter tag; acquiring target parameter information entered by the user via the category parameter interface; and obtaining target display information corresponding to the target category identifier according to the target parameter information, and displaying the target display information.

14 Claims, 9 Drawing Sheets

METHOD AND APPARATUS FOR DISPLAYING INFORMATION OF MOTOR, AND COMPUTER DEVICE

CROSS REFERENCE TO RELATED APPLICATIONS

This non-provisional patent application is a continuation application of International Application PCT/CN2019/094088, filed on Jun. 30, 2019, the content of which is incorporated herein by reference.

TECHNICAL FIELD

The present disclosure relates generally to motors and, in particular, to a method and an apparatus for displaying information of a motor, and a computer device.

BACKGROUND

To promote motor products, relevant information, such as, basic parameters and resonance frequency, of the motor usually need to be displayed to customers, so that the customers can get a comprehensive understanding of the relevant information of the motor.

An existing method for displaying the information of the motor involves the use of product specification, i.e. the product specification which describes the relevant information of the motor is presented to the customers. However, reading the product specification can be boring. In addition, the product specification is usually made by the motor manufacturer itself, who may be suspected of fraud in the product specification, making the product specification less convincing.

SUMMARY

Accordingly, embodiments of the present disclosure are directed to a method and an apparatus for displaying information of a motor which can address at least one of the problems mentioned above.

In one independent aspect, a method for displaying information of a motor is provided which includes: acquiring a target category identifier of a target motor; determining a category parameter interface according to the target category identifier, and displaying the category parameter interface, wherein the category parameter interface displays a category parameter tag that prompts a user to enter parameter information corresponding to the category parameter tag; acquiring target parameter information entered by the user via the category parameter interface; and obtaining target display information corresponding to the target category identifier according to the target parameter information, and displaying the target display information.

In one embodiment, the target category identifier is a basic parameter category identifier; the target parameter information comprises target excitation signal information; and the target display information comprises basic parameters of the motor.

In one embodiment, the target excitation signal information comprises preset type target excitation signal information and designed type target excitation signal information. The category parameter interface further displays an excitation signal generating button. The method further includes: detecting a state of the excitation signal generating button; determining that the target excitation signal information is the designed type target excitation signal information if it is detected that the excitation signal generating button is triggered; and determining that the target excitation signal information is the preset type target excitation signal information if it is detected that the excitation signal generating button is not trigged.

In one embodiment, the target category identifier is a resonance frequency identifier; the resonance frequency identifier includes a sweep frequency type identifier and/or a residual vibration type identifier. If the resonance frequency identifier is the sweep frequency type identifier, the category parameter tag is a sweep frequency signal design tag which is used to prompt the user to enter basic parameters of a sweep frequency signal. The target parameter information comprises the basic parameters of the sweep frequency signal that are used to generate a target sweep frequency signal according to the basic parameters of the sweep frequency signal. The target display information comprises a frequency-swept resonance frequency obtained by exciting the target motor using the target sweep frequency signal.

If the resonance frequency identifier is the residual vibration type identifier, the category parameter tag is an excitation signal voltage design tag and a reference resonance frequency tag. The category parameter tag is used to prompt the user to enter a voltage design parameter for the excitation signal and a reference resonance frequency. The target parameter information comprises the voltage design parameter and the reference resonance frequency. The voltage design parameter comprises an initial voltage amplitude and a voltage amplitude interval. The target display information comprises a plurality of residual vibration type resonant frequencies determined according to the initial voltage amplitude and the voltage amplitude interval.

In one embodiment, the target category identifier is a model design excitation signal identifier; the target parameter information comprises basic parameters of the motor, a motor model and basic parameters of the excitation signal. The target display information comprises a simulated excitation signal waveform obtained according to the basic parameters of the motor, the motor model and basic parameters of the excitation signal.

In one embodiment, the target category identifier is a backstepping design excitation signal identifier. The target parameter information comprises a noise-signal ratio, a preset excitation signal, a target vibration signal, a target maximum vibration quantity and a maximum length of the target excitation signal. The target display information comprises a target excitation signal waveform obtained according to the noise-signal ratio, the preset excitation signal, the target vibration signal, the target maximum vibration quantity and the maximum length of the target excitation signal.

In one embodiment, the target category identifier is a reference design excitation signal identifier. The target parameter information comprises basic parameters of a reference motor, an excitation signal of the reference motor, basic parameters of a target motor and maximum voltage of the target excitation signal. The target display information comprises a target excitation signal waveform of the target motor determined according to the basic parameters of the reference motor, the excitation signal of the reference motor, the basic parameters of the target motor and the maximum voltage of the target excitation signal.

In another independent aspect, an apparatus for displaying information of a motor is provided. The apparatus includes a first acquisition module for acquiring a target category identifier of a target motor; a first display module for determining a category parameter interface according to the target category identifier, and displaying the category parameter interface, wherein the category parameter interface displays a category parameter tag that prompts a user to enter parameter information corresponding to the category parameter tag; a second acquisition module for acquiring target parameter information entered by the user via the category parameter interface; and a second display module for obtaining target display information corresponding to the target category identifier according to the target parameter information, and displaying the target display information.

In another independent aspect, a computer device includes a processor and a memory in communication with the processor. The memory has a computer program stored thereon. The computer program is executable by the processor to implement a method for display information of a motor. The method includes acquiring a target category identifier of a target motor; determining a category parameter interface according to the target category identifier, and displaying the category parameter interface, wherein the category parameter interface displays a category parameter tag that prompts a user to enter parameter information corresponding to the category parameter tag; acquiring target parameter information entered by the user via the category parameter interface; and obtaining target display information corresponding to the target category identifier according to the target parameter information, and displaying the target display information.

In still another independent aspect, a computer readable storage medium is provided which has a computer program stored thereon. The computer program is executable by a processor to implement a method for display information of a motor, the method including acquiring a target category identifier of a target motor; determining a category parameter interface according to the target category identifier, and displaying the category parameter interface, wherein the category parameter interface displays a category parameter tag that prompts a user to enter parameter information corresponding to the category parameter tag; acquiring target parameter information entered by the user via the category parameter interface; and obtaining target display information corresponding to the target category identifier according to the target parameter information, and displaying the target display information.

In summary, the present disclosure provides a method and an apparatus for displaying information of a motor, a computer device and a computer-readable storage medium. The method includes: first acquiring the target category identifier of the target motor; determining and displaying the category parameter interface according to the target category identifier, wherein the category parameter interface displays the category parameter tag that is used to prompt the user to enter parameter information corresponding to the category parameter tag; acquiring the target parameter information entered by the user via the category parameter interface; and finally, obtaining and displaying the target display information corresponding to the target category identifier according to the target parameter information. It can be seen that, with the method described above, the user can check various display information through selecting the target category identifier. In addition, after determining the target category of display information to be displayed, the user further enters the target parameter information, such that the outputted target display information is obtained in response to the user input, instead of the information pre-printed on the product specification. As different target display information may be outputted corresponding to different target parameter information, the displaying method disclosed herein can effectively stop printing fraud and make the finally displayed target display information more convincing.

Independent features and/or independent advantages of this disclosure may become apparent to those skilled in the art upon review of the detailed description, claims and drawings.

DESCRIPTION OF THE EMBODIMENTS

The present disclosure will be described further below with reference to the accompanying drawings and embodiments.

Figure 1:
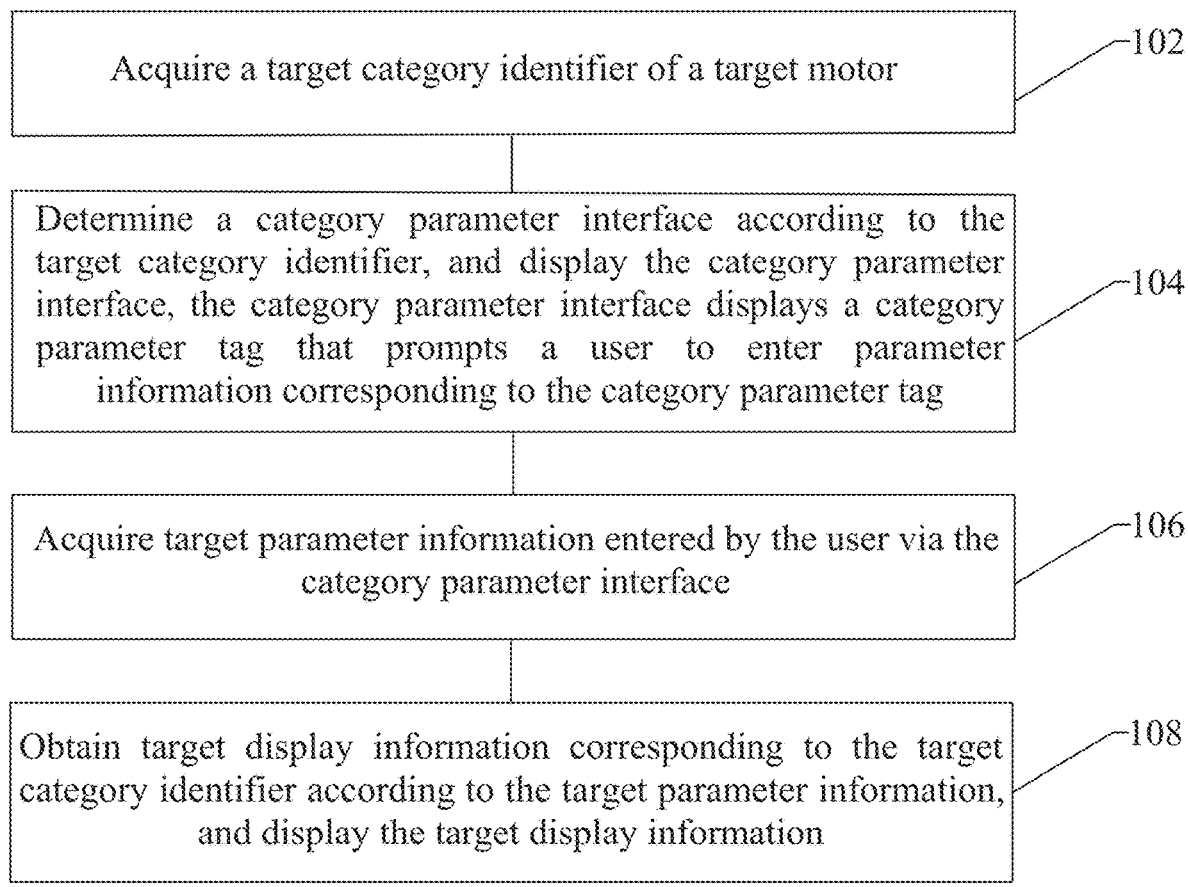
FIG. 1 is a flowchart of a method for displaying information of a motor according to one embodiment.

As shown in FIG. 1, in one embodiment, a method for displaying information of a motor is provided. In this embodiment of the present disclosure, the method for displaying the information of a motor is implemented by an apparatus capable of implementing the method for displaying information of a motor of the present embodiment. The apparatus can include, but is not limited to, a desktop computer and a server. The method for displaying information of a motor specifically includes the following steps.

At Step 102, target category identifiers of a target motor are acquired.

The target category identifiers are used to identify to-be-display information of the motor. The to-be-display information of the motor can include, but not limited to, basic parameters and resonance frequency of the motor, a motor excitation signal obtained by model design, a motor excitation signal obtained by backstepping design (Wiener inverse filtering), and a motor excitation signal obtained by reference design (equilibrium compensation design).

The target category identifier can be composed of numbers and/or characters and/or letters. For example, a target category identifier aa1b identifies the basic parameters of the motor as the to-be-displayed information of the motor, and a target category identifier bb2c identifies the resonance frequency of the motor as the to-be-displayed information of the motor. The target category identifier can also be the Chinese names of the to-be-displayed information of the motor. For example, if the target category identifier is the basic parameters of the motor, then the Chinese names of the basic parameters of the motor are identified as the to-be-displayed information of the motor.

Just as an example, before displaying the to-be-displayed information of the motor to a customer, a user first selects a tag of a particular category from a category determination interface displayed by a desktop terminal or a server, the category determination interface displaying category tags of all categories. Once the user has clicked on the particular category tag, the desktop terminal or the server acquires the target category identifier of the target motor.

At Step 104, a category parameter interface is determined and displayed according to the target category identifier. The category parameter interface displays a category parameter tag, and the category parameter tag is used to prompt a user to enter parameter information corresponding to the category parameter tag.

The category parameter tag is a preset mark on the category parameter interface. The preset mark prompts the user to enter parameter information corresponding to the category parameter tag. The preset mark can prompt the user to enter a specific parameter value or select a parameter. Alternatively, the mark can also be designed in the form of a button, and the parameter information can be acquired by clicking on the button. The parameter information, which is input information required to obtain the to-be-displayed information, can be, but not limited to, a specific parameter value, a model (for example, a kernel function model), a waveform curve, or the like.

The desktop terminal or server is provided with a correspondence between the category identifiers and the category parameter interface. When the target category identifier is acquired, the category parameter interface corresponding to the target category identifier can be determined according to the correspondence between the category identifiers and the category parameter interfaces. For example, the target category identifier aa1b corresponds to the category parameter interface A, and the target category identifier aa2c corresponds to the category parameter interface B.

At Step 106, the target parameter information entered by the user via the category parameter interface is acquired.

The target parameter information is input information required to obtain target display information.

At Step 108, target display information corresponding to the target category identifier is obtained and displayed according to the target parameter information.

The target display information that needs to be displayed to the customer is obtained according to the target parameter information through mathematic calculation or detection by an accelerator or the like.

The method for displaying the information of a motor described above includes the following steps: first acquiring the target category identifier of the target motor; determining and displaying the category parameter interface according to the target category identifier, wherein the category parameter interface displays the category parameter tag that prompts the user to enter parameter information corresponding to the category parameter tag; acquiring the target parameter information entered by the user via the category parameter interface; and finally, obtaining and displaying the target display information corresponding to the target category identifier according to the target parameter information. It can be seen that, with the method described above, the user can check various display information by selecting the target category identifier. In addition, after determining the target category of display information to be displayed, the user further enters the target parameter information, such that the outputted target display information is obtained in response to the user input, instead of the information pre-printed on the product specification. As different target display information may be outputted corresponding to different target parameter information, the displaying method disclosed herein can effectively stop printing fraud and make the finally displayed target display information more convincing.

In one embodiment, the target category identifier is a basic parameter category identifier; the target parameter information includes target excitation signal information; and the target display information includes basic parameters of the motor.

The basic parameter category identifier is used to indicate that the to-be-displayed motor information includes the basic parameters of the motor. The target excitation signal information can directly be a path of a pre-designed target excitation signal, a pre-designed excitation signal, or one or more excitation signal parameters required to be set to generate the target excitation signal. The basic parameters of the motor are parameters which reflect the inherent properties of the motor, including, but not limited to, Re (DC impedance of the motor), Le (inductance of a voice coil of the motor), and (mass of a vibrator of the motor), B1 (electromagnetic force coefficient of the motor), Km (spring stiffness coefficient), and Cd (damping of the motor).

Figure 2:
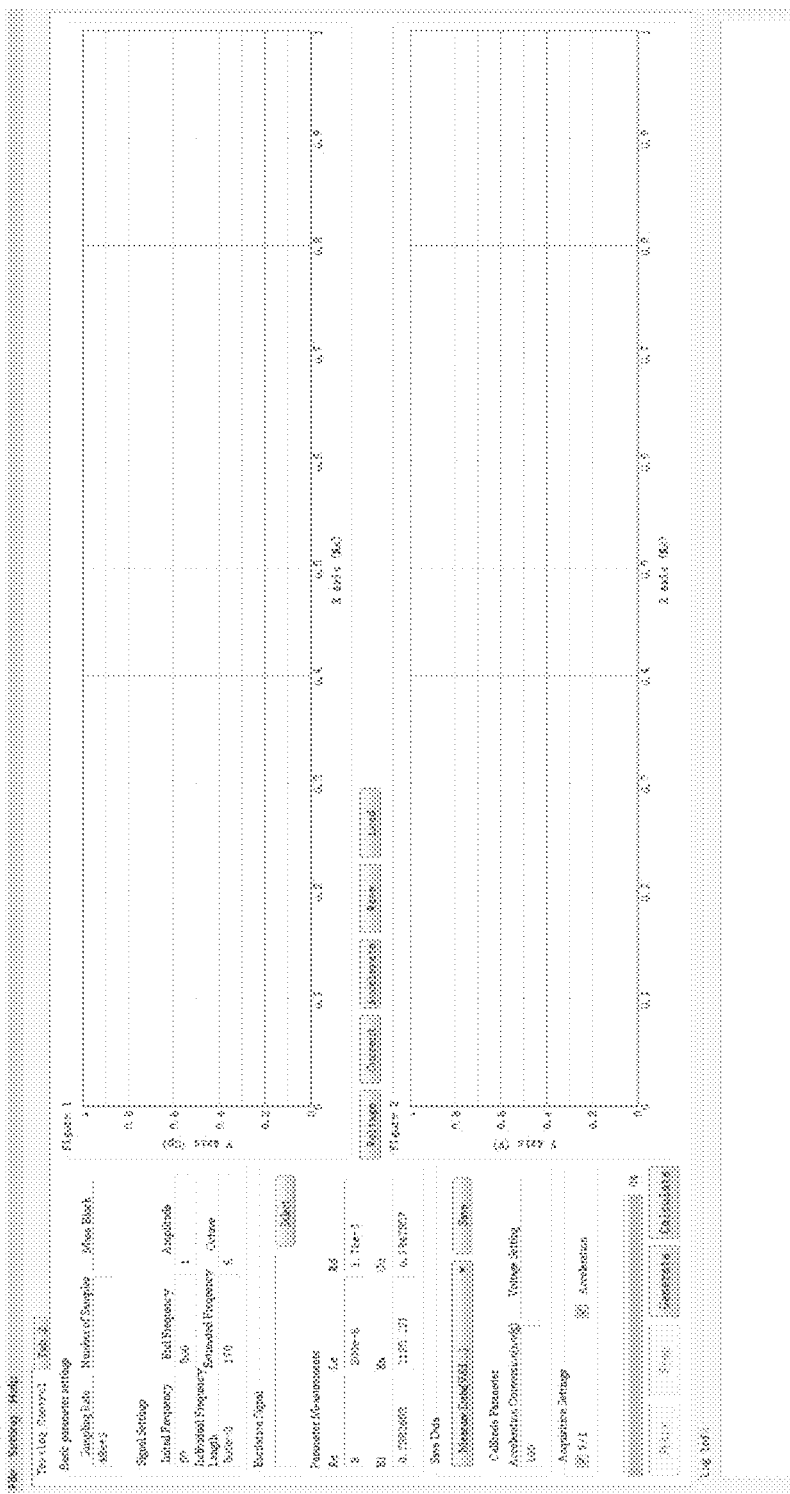
FIG. 2 is a schematic diagram showing a category parameter interface for basic parameters according to one embodiment.

FIG. 2 illustrates an exemplary category parameter interface for basic parameters acquired according to the basic parameter category identifier. On this interface, if the user has no idea of how to set the excitation signal, the user can click on a "Select" button at the category parameter tag of "Excitation signal" to select a preset excitation signal. Alternatively, the user can also enter parameters such as "Initial Frequency", "End Frequency", "Amplitude", "Individual Frequency Length", "Estimated Frequency", "Octave", "Sampling Rate", "Number of Samples" and "Mass Block (tool mass)" to self-design and obtain the excitation signal. The "Individual Frequency Length" is the duration of each of the frequencies; and the "Estimated Frequency" is set mainly for the purpose of performing measurement near the resonance frequency F0 of the motor to obtain more information, thus obtaining better measurement and calculation results. After determining the target excitation signal information, the user can click on a "Start" button to send the excitation signal to excite the motor, and click on a "Stop" button to interrupt the currently running program. By setting the excitation signal for exciting the motor, the basic parameters of the motor, for example, Re, Le, Md, etc., can be obtained through calculation, and the measured basic parameters of the motor can be displayed at "Parameter Measurements" fields. Alternatively, for example, the generation of the basic parameters of the motor can be manually controlled by clicking on a "Calculate" button. After the "Calculate" button is clicked, the basic parameters of the target motor are calculated through a data fitting calculation based on the acquired voltage and current. After obtaining the basic parameters of the motor, the user can also select a location and/or a data type at a category parameter tag of "Save Data" to save the basic parameters of the motor. After measuring and obtaining the voltage, current and acceleration, the user can also select a location and/or a data type at the "Save Data" category parameter tag to save the voltage, current and acceleration. On the category parameter interface for basic parameters, if the user wants to improve the measurement precision, the user can also set an "Acceleration Conversion" parameter (this parameter aims at the sensitivity of an accelerometer) and a "Voltage Setting" parameter (this parameter is directed to the voltage of the excitation signal) at a category parameter tag of "Calibrate Parameter". On the category parameter interface for basic parameters, the user can also determine which data is to be acquired through an "Acquisition Settings" category parameter tag to, for example, acquire "V/I" (Voltage & Current" and/or "Acceleration" (vibration acceleration of the motor) data. On the category parameter interface for basic parameters, the user can click on "FIG. 1" and "FIG. 2" to display relevant waveform data, click on "Voltage" to check voltage data, click on "Current" to check current data, click on "Acceleration" to check acceleration data, click on "Load" to import and display previously tested voltage, current and acceleration data, and click on "Wave" to check the excitation signal. A "Log Info" field displays a progress (for example, a data measurement progress, or a data calculation progress), or a program error, etc.

Further, the target excitation signal information includes preset type target excitation signal information and designed type target excitation information. The category parameter interface also displays an excitation signal generating button. The method further includes the following steps: detecting a state of the excitation signal generating button; determining that the target excitation signal information is the designed type target excitation signal information if it is detected that the excitation signal generating button is triggered; and determining that the target excitation signal information is the preset type target excitation signal information if it is detected that the excitation signal generating button is not triggered.

The preset type target excitation signal information can directly be a path of a pre-designed target excitation signal, or a pre-designed excitation signal. The designed type target excitation signal information includes excitation signal parameters required to be set to generate the target excitation signal. If it is detected that the excitation signal generating button is triggered, the target excitation signal information is the designed type target excitation signal information. For example, the user clicks on "Start" after clicking on "Generate", then the excitation signal is obtained according to the designed type target excitation signal information. If the user directly clicks on "Start" without clicking on "Generate", the excitation signal is obtained according to the preset type target excitation signal information.

In one embodiment, the target category identifier is a resonance frequency identifier, and the resonance frequency identifier includes a sweep frequency type identifier and/or a residual vibration type identifier. If the resonance frequency identifier is the sweep frequency type identifier, the category parameter tag is a sweep frequency signal design tag, and the sweep frequency signal design tag is used to prompt the user to enter basic parameters of a sweep frequency signal. The target parameter information includes the basic parameters of the sweep frequency signal, and the target sweep frequency signal is generated according to the basic parameters of the sweep frequency signal. The target display information includes a frequency-swept resonance frequency obtained by exciting the target motor using the target sweep frequency signal. If the resonance frequency identifier is the residual vibration type identifier, the category parameter tag includes a voltage design tag and a reference resonance frequency tag for the excitation signal. The category parameter tag is used to prompt the user to enter a voltage design parameter and a reference resonance frequency for the excitation signal. The target parameter information includes voltage design parameters and the reference resonance frequency, the voltage design parameters include an initial voltage amplitude and a voltage amplitude interval, and the target display information includes a plurality of residual vibration type resonant frequencies determined according to the initial voltage amplitude and the voltage amplitude interval.

The resonance frequency identifier is used to indicate that the to-be-display motor information includes the resonance frequency. The sweep frequency type identifier is used to indicate the resonance frequency obtained by frequency sweep, and the residual vibration type identifier is used to indicate the resonance frequency obtained by residual vibration. Basic parameters of the sweep frequency signal include, but are not limited to, "Initial Frequency", "End Frequency", "Amplitude", "Individual Frequency Length", and "Octave". The frequency-swept resonance frequency is a resonance frequency obtained by frequency sweep. The voltage design parameters include the initial voltage amplitude and the voltage amplitude interval, and a plurality of voltages can be generated according to the initial voltage amplitude and the voltage amplitude interval. For example, when the initial voltage amplitude is 1V and the voltage amplitude interval is 0.2 V, then three voltages 1V, 1.2V and 1.4V can be obtained. The reference resonance frequency is a reference value for the resonance frequency.

Figure 3:
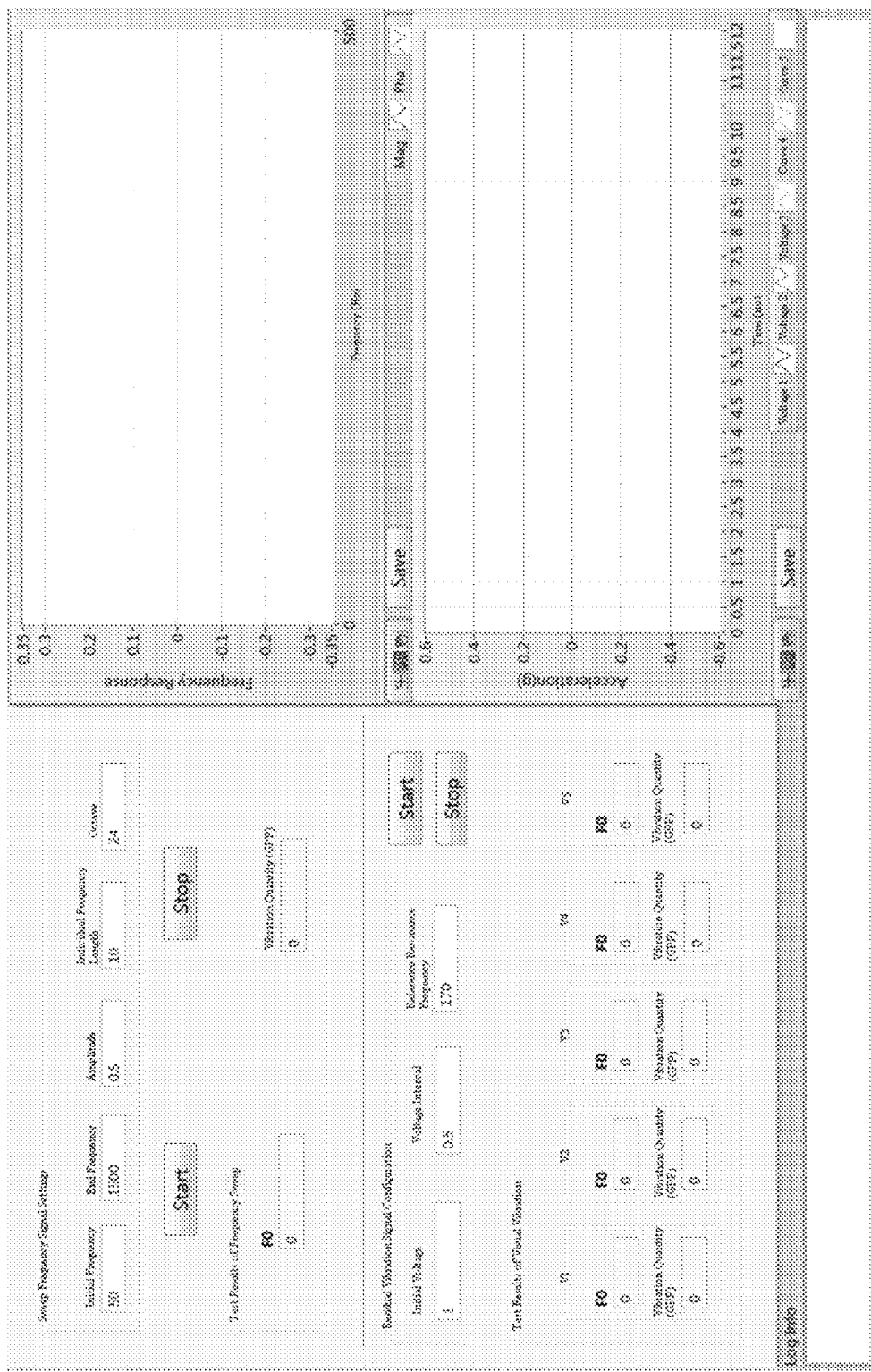
FIG. 3 is a schematic diagram showing a category parameter interface for resonance frequency according to one embodiment.

FIG. 3 illustrates an exemplary category parameter interface for resonance frequency acquired according to the resonance frequency category identifier. On this interface, the user can enter "Initial frequency", "End frequency", "Amplitude", etc. at a category parameter tag of "Sweep Frequency Signal Settings" to set the sweep frequency signal. The sweep frequency signal can be generated based on these settings. The user can click on a "Start" button to send a designed sweep frequency signal to excite the motor, and click on a "Stop" button to interrupt the currently running program. After frequency sweep ends, a "Test Results of Frequency Sweep" field displays the target display information obtained by frequency sweep. In addition to the frequency-swept resonance frequency "F0", the target display information can also include "Vibration Quantity GPP", wherein the "Vibration Quantity GPP" is a vibration quantity corresponding to a resonance frequency point, which is the maximum vibration quantity during the vibration of the motor. On this interface, the user can also enter the "Initial frequency" and "Voltage Interval" of the excitation signal at a category parameter tag of "Residual Vibration Signal Configuration", and can also enter the "Reference Resonance Frequency" to compare with the finally obtained resonance frequency. A "Test Results of Residual Vibration" field displays the obtained target display information. In addition to the frequency-swept resonance frequency "F0", the resonance frequency category parameter interface can also be provided with a curve display area. The curve display area includes two curve display sub-areas. "Frequency Response", one of the curve display sub-areas, can display a sweep frequency response curve of the target motor in real time, and the coordinate axes can be frequency vs (GN), and can also be frequency vs absolute vibration quantity. After residual vibration test is completed, "Acceleration (g)", the other curve display sub-area, displays a vibration acceleration curve at different voltages. A "Log Info" field displays a progress (for example, a data measurement progress or a data calculation progress), or a program error, etc.

In one embodiment, the target category identifier is a model design excitation signal identifier. The target parameter information includes basic parameters of the motor, a motor model and basic parameters of the excitation signal.

The target display information includes simulated excitation signal waveform according to the basic parameters of the motor, a motor model and basic parameters of the excitation signal.

The model design excitation signal identifier is used to indicate the excitation signal of the motor obtained by model design. The model of the motor can include, but is not limited to, a second-order model or a kernel function model. The basic parameters of the excitation signal can include, but are not limited to, maximum voltage, maximum length of the excitation signal, and acceleration section number (i.e. times of motor acceleration).

Figure 4:
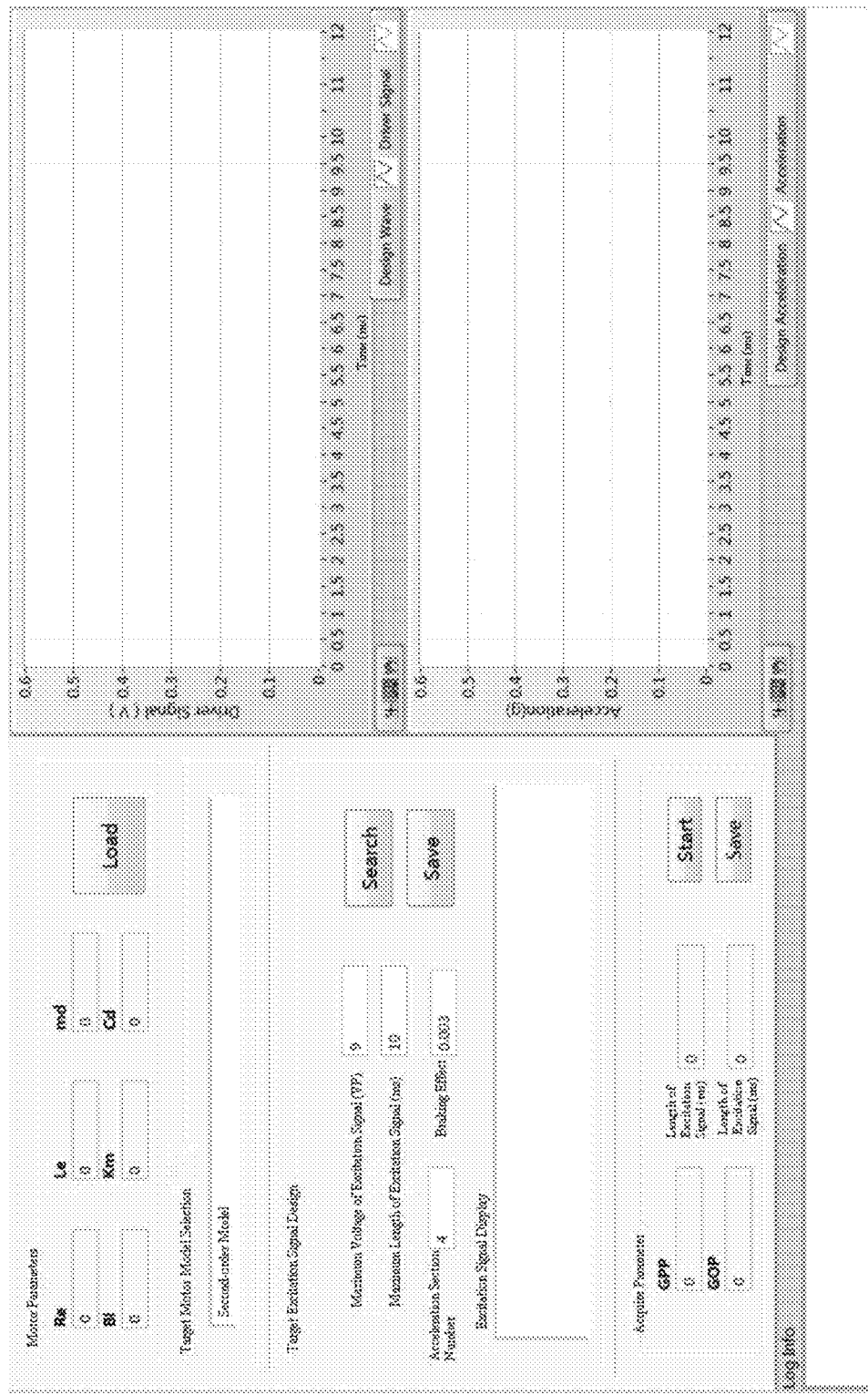
FIG. 4 is a schematic diagram showing a category parameter interface for model design according to one embodiment.

FIG. 4 illustrates an exemplary category parameter interface for model design acquired according to the model design excitation signal identifier. On this interface, the user can click on a "Load" button at a category parameter tag of "Motor Parameters of" to import the basic parameters Re, Le, etc. of the target motor. The user can also select a model for the motor at a category parameter tag of "Target Motor Model Selection". The user can also enter a maximum voltage of the excitation signal, a maximum length of the excitation signal, an acceleration section number, and a braking effect at the category parameter tag of "Target Excitation Signal Design". Then, the user can click on a "Search" button to obtain a simulated excitation signal waveform according to the basic parameters of the motor, the model model, and the basic parameters of the excitation signal. Multiple simulated excitation signal waveforms which meet the requirements of the basic parameters of the motor, the model of the motor, and the basic parameters of the excitation signal may be obtained under such circumstance. These simulated excitation signal waveforms can be displayed in an "Excitation signal Display" field. The user can click on and select one of the simulated excitation signal waveforms to drive the target motor. Moreover, the user can also click on a "Save" button at the category parameter tag of "Target Excitation signal Design" to save of the multiple simulated excitation signals or save the selected simulated excitation signal. The user can click on a "Start" button at "Acquire Parameter" field to use the selected simulated excitation signal to drive the target motor, while the system starts to acquire the voltage, current and vibration acceleration data, and calculates and obtains the maximum vibration quantity "GPP", "Length of Excitation signal (ms)", one-way maximum vibration quantity "GOP" and "Length of Vibration Signal (ms)" according to those data. The user can click on a "Save" button at "Acquire Parameter" to save the acquired voltage, current and vibration acceleration data. Moreover, the waveform display area on the category parameter interface for model design can also display acquired voltage waveform and vibration acceleration waveform. The waveform display area includes two waveform display sub-areas. "Driver Signal", one of the waveform display sub-areas, can display the simulated excitation signal waveform obtained by design and the excitation signal waveform actually acquired after the simulated model design signal waveform is used to excite the motor. "Acceleration(g)", the other waveform display sub-area, can display the simulated acceleration waveform calculated according to the simulated excitation signal waveform and the vibration acceleration waveform actually acquired after the simulated excitation signal waveform is used to excite the motor. A "Log Info" field displays a progress (for example, a data measurement progress or a data calculation progress), or a program error, etc.

In one embodiment, the target category identifier is a backstepping design excitation signal identifier. The target parameter information includes a noise-signal ratio, a preset excitation signal, a target vibration signal, a target maximum vibration quantity and a maximum length of the target excitation signal. The target display information includes a target excitation signal waveform obtained according to the noise-signal ratio, the preset excitation signal, the target vibration signal, the target maximum vibration quantity and the maximum length of the target excitation signal.

The backstepping design excitation signal identifier is used to indicate a method for backstepping design of the excitation signal of the motor according to the target vibration signal of the motor. The noise-signal ratio is a ratio of a power spectrum function of noises to the power spectrum function of the input signal. The preset excitation signal is a pre-designed excitation signal. The target maximum vibration quantity is the maximum vibration quantity generated by the motor when driven by the target excitation signal. The maximum length of the target excitation signal indicates that the length of the target excitation signal obtained by backstepping design may not exceed the maximum length of the target excitation signal.

Figure 5:
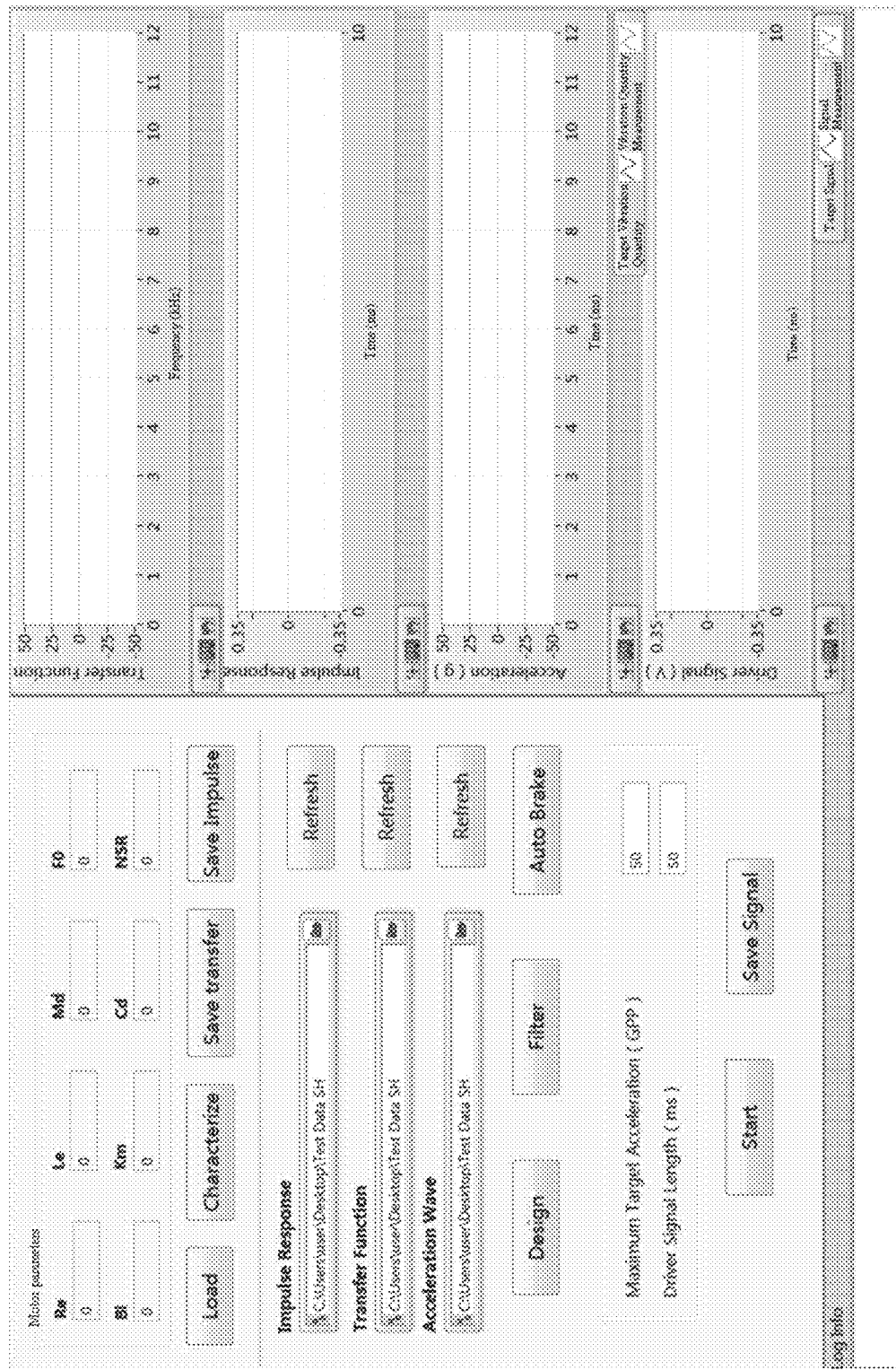
FIG. 5 is a schematic diagram showing a category parameter interface for backstepping design according to one embodiment.

FIG. 5 illustrates an exemplary category parameter interface for backstepping design acquired according to the backstepping design excitation signal identifier. On this interface, the user can click on a "Characterize" button to obtain a preset target excitation signal. The target excitation signal may be a white noise. Exciting the motor with the preset target excitation signal can generate a transfer function and an impulse response function for calculating the target excitation signal. The transfer function and the impulse response function are respectively displayed in a "Transfer Function" curve display area and an "Impulse Response" curve display area on the category parameter interface for backstepping design. The user can click on a "Save transfer" button to save the obtained transfer function, and click on a "Save Impulse" button to save the obtained impulse response function. Specifically, the transfer function and the impulse response function can be saved at preset target locations. The user can click on a "Load" button at the category parameter tag of "Motor Parameters" to load a plurality of motor parameters of the so as to obtain the noise-signal ratio NSR. The user can import a target vibration signal at "Acceleration Wave", enter the maximum vibration quantity of the motor at "Maximum Target Acceleration (GPP)", and enter the maximum length of the target excitation signal at "Driver Signal Length (ms)". After setting the target parameter information described above, the user can click on a "Design" button to obtain the target excitation signal waveform according to the target parameter information described above, click on a "Start" button to excite the target motor using the obtained target excitation signal, and click on a "Save Signal" button to save the obtained target excitation signal. The target excitation signal can be saved at a designated location. With the target motor being excited, a back end of the system acquires data such as the voltage, current and acceleration to obtain the acquired excitation signal. The "Driver Signal (V)" curve display area can display the obtained target excitation signal and the acquired excitation signal, and the "Acceleration (g)" curve display area can display the calculated vibration acceleration waveform and the actually acquired vibration acceleration waveform. On the category parameter interface for backstepping design, the user can click on the "Load" button at a category parameter tag of "Motor Parameters" to display the basic parameters of the motor such that the customer can get more information of the motor. On the category parameter interface for backstepping design, the user can import the previously calculated impulse response function at "Impulse Response", and click on a "Refresh" button at "Impulse Response" to display the imported impulse response function in the "Impulse Response" curve display area. The user can import the previously calculated transfer function at the "Transfer Function", and click on a "Refresh" button at the "Transfer Function" to display the imported transfer function in the "Transfer Function" curve display area. The user can import the target vibration signal waveform at "Acceleration Wave", and click on a "Refresh" button at the "Acceleration Wave" to display the imported target signal waveform in the curve display area. The user can click on a "Filter" button to perform smoothing treatment on the target vibration signal so as to remove burrs of the target vibration signal and therefore obtain a better target excitation signal. The user can click on an "Auto Brake" button to add a braking effect to the target excitation signal (for example, the target excitation signal and the braking signal are spliced to obtain a braking signal with a braking effect). A "Log Info" field displays a progress (for example, a data measurement progress or a data calculation progress), or a program error, etc.

In one embodiment, the target category identifier is a reference design excitation signal identifier. The target parameter information includes basic parameters of a reference motor, an excitation signal of the reference motor, basic parameters of a target motor and a maximum voltage of the target excitation signal. The target display information includes a target excitation signal waveform of the target motor determined according to the basic parameters of the reference motor, the excitation signal of the reference motor, the basic parameters of the target motor and the maximum voltage of the target excitation signal.

The reference design excitation signal identifier is used to indicate a method for determining excitation information of the target motor according to information of the reference motor. Specifically, a target vibration signal displacement (vibration amplitude of the vibrator of the motor) can be obtained according to the basic parameters of the reference motor and the excitation signal of the reference motor. Then, the target excitation signal of the target motor can be determined according to the target vibration signal displacement, the basic parameters of the target motor and the maximum voltage of the target excitation signal.

Figure 6:
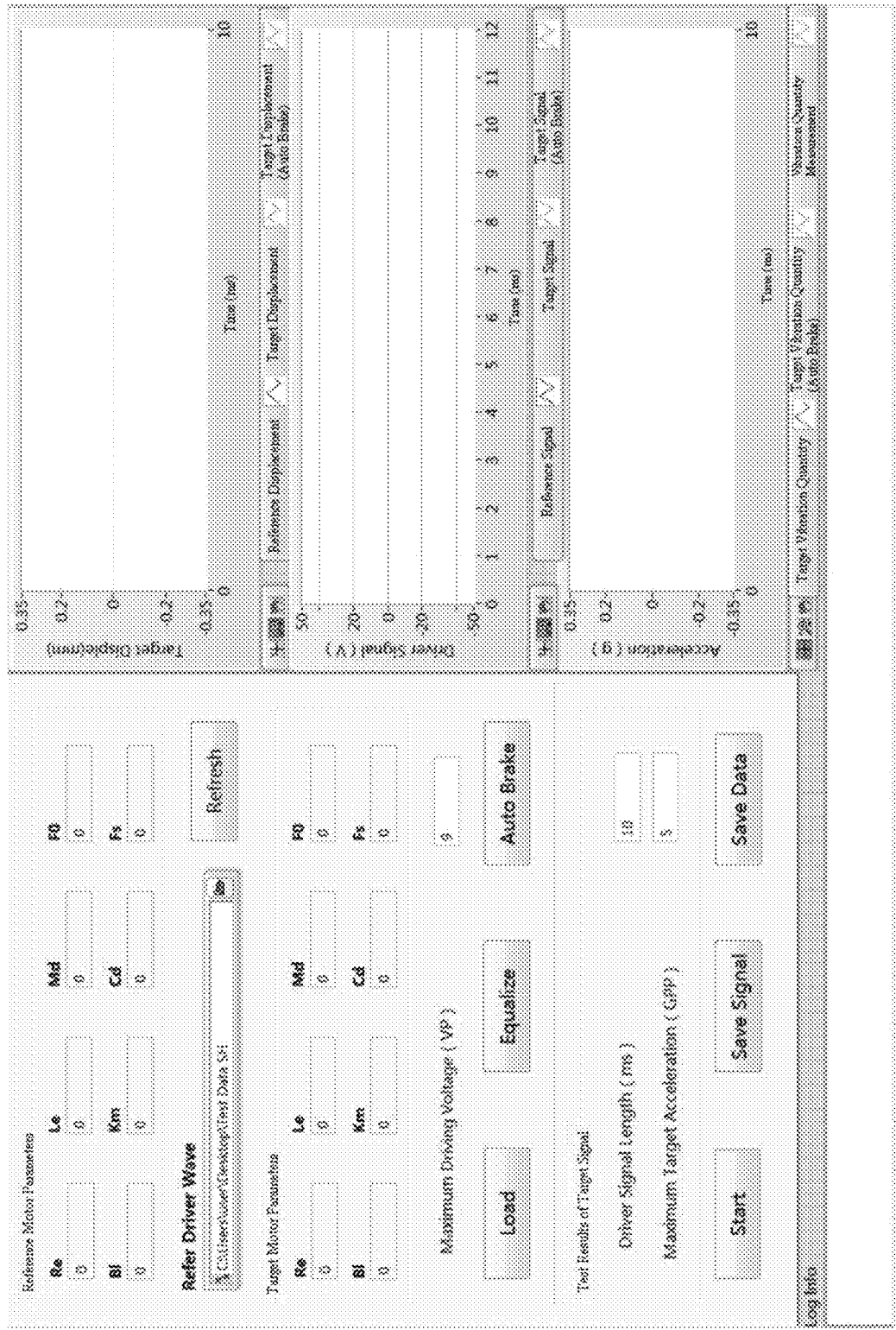
FIG. 6 is a schematic diagram showing a reference category parameter interface according to one embodiment.

FIG. 6 illustrates an exemplary reference category parameter interface acquired according to the reference excitation signal identifier. The user needs to fill in the basic parameters of the reference motor, for example parameter Re and parameter Le, at a category parameter tag of "Reference Motor Parameters". The user can load an excitation signal for the reference motor at a category parameter tag of "Reference Driver Wave", and click on a "Refresh" button at the "Reference Driver Wave" to display the loaded excitation signal for the reference motor. The user can click on a "Load' button at a category parameter tag of "Target Motor Parameters" to load the pre-tested basic parameters of the target motor, and display the pre-tested basic parameters in respective parameter display fields. The user also needs to enter the maximum voltage of the excitation signal at "Maximum Driving Voltage(VP)". After completing the above steps, the user needs to click on an "Equalize" button, and then the back end of the system determines the target excitation signal according to the target parameter information as set above, and at the same time, can obtain the target vibration signal displacement of the target motor. Then, the user can click on a "Save Signal" button to save the obtained target excitation signal of the target motor. The target excitation signal of the target motor can be displayed in a "Driver Signal Wave(V)" curve display field. The target vibration signal displacement can be displayed in a "Target Disple(mm)" curve display field. In addition, the system back end can also measure the length of the target excitation signal of the target motor and the maximum vibration quantity of the target motor, and display the excitation signal length of the target motor in a "Driver Signal Length(ms)" field and the maximum vibration quantity of the target motor in a "Maximum Target Acceleration(GPP)" field at "Test Results of Target Signal". Moreover, the system back end can also acquire the voltage, current and acceleration of the target motor driven by the target excitation signal, and the user can click on a "Save" button to save the acquired voltage, current and acceleration data. The reference category parameter interface is also provided with curve display areas. A "Target Disple(mm)" curve display area can display a vibration signal displacement curve of the reference motor, a target vibration signal displacement curve of the target motor, and a target vibration signal displacement curve obtained after a braking effect is added. A "Driver Signal(V)" curve display area can display an excitation signal waveform of the reference motor, a target excitation signal waveform of the target motor, and a target excitation signal waveform obtained after a braking effect is added. An "Acceleration(g)" curve display area can display a vibration acceleration waveform of the reference motor, a vibration acceleration waveform obtained after a braking effect is added, and a vibration acceleration waveform obtained through measurement after the target excitation signal is used to drive the target motor. A "Log Info" field displays a progress (for example, a data measurement progress or a data calculation progress), or a program error, etc.

Figure 7:
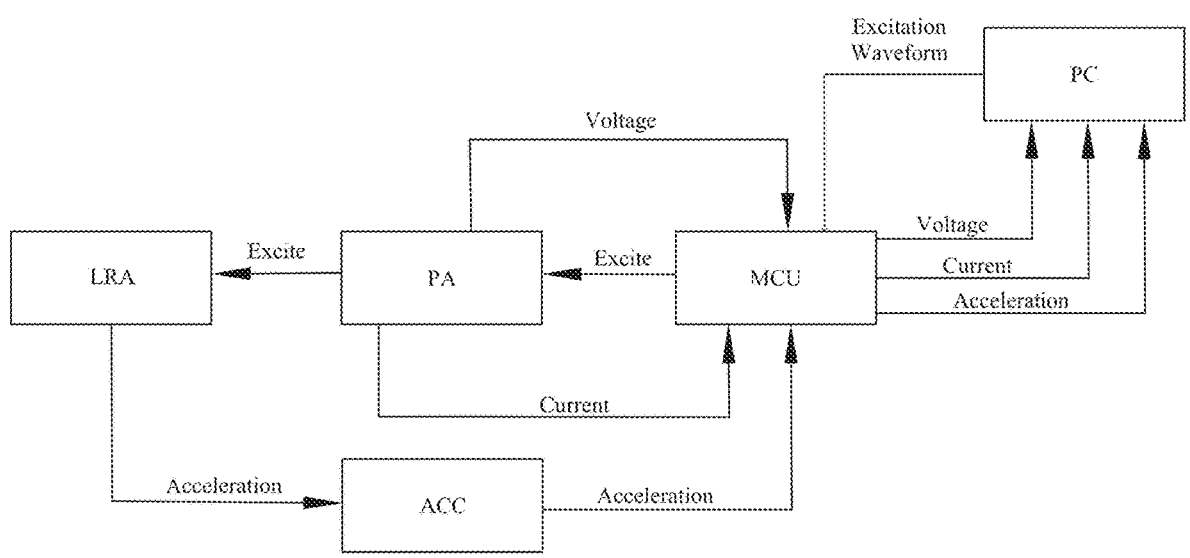
FIG. 7 is a composite structural diagram showing a system for displaying information of a motor according to one embodiment.

As shown in FIG. 7, in an exemplary embodiment, the method for displaying information of a motor according to the embodiments of the present disclosure can be applied to a system for displaying information of a motor. The system for displaying information of a motor includes an apparatus (PC) for implementing the method for displaying information of a motor, a micro control unit (MCU), a motor driving system PA, a motor system (LRA), and an acceleration data acquisition system ACC (including an acceleration sensor and an accelerometer analogue signal conditioning module). The apparatus (PC) for implementing the method for displaying information of a motor is connected with the MCU through a USB to transmit motor excitation signals, receive tested voltage, current and vibration acceleration data, calculate the basic performance parameters of the motor, design the excitation signals, and intuitively display different display information of different motors. The MCU is a 32-bit microprocessor system capable of processing digital signals, for example, Cortex-M4 STM32F4 series chips manufactured by STM Corporation. The MCU is individually packaged and includes the following external interfaces: a USB interface, a power supply interface, a driver IC interface, a voltage, current and vibration acceleration data interface. The power supply for the MCU needs to provide instantaneous power not less than 5V@3A. The MCU supports simultaneous input of three channels of a three-axis acceleration sensor, with a sampling rate not less than 20K@8 Bit. Moreover, the MCU also supports two-path drive output of the motor, and supports a sampling rate of the working voltage and current of the motor not less than 24K@8 Bit. The motor driving system is connected with the MCU and required to output power of over 8w at an 8Ω load, and is capable of feeding voltage and current data back. A bus interface of the motor driving system includes I2S, I2C, etc.

The motor driving system can adopt a driver IC manufactured by Maxim company. The motor system is a platform for carrying the motor. The motor system can be a standard 100 g tooling (the tooling can be a physical metal block, a pressure tooling or a mobile phone tooling). The motor system also includes a motor. The acceleration data acquisition system includes an acceleration sensor and an accelerometer analogue commissioning module, acquires the vibration acceleration data in real time when the motor is working, and transmits the acquired data to the MCU. The acceleration sensor works in a frequency range of 10-10000 Hz, and has a measurement range not less than ±10 g. The acceleration sensor can be a three-axis acceleration sensor manufactured by Dytran Company. The accelerometer analogue signal conditioning module is used in combination with the acceleration sensor, and is required to have corresponding filtering function. The accelerometer analogue signal conditioning module can be a 1704-A-002 conditioning module manufactured by B&K Company.

Figure 8:
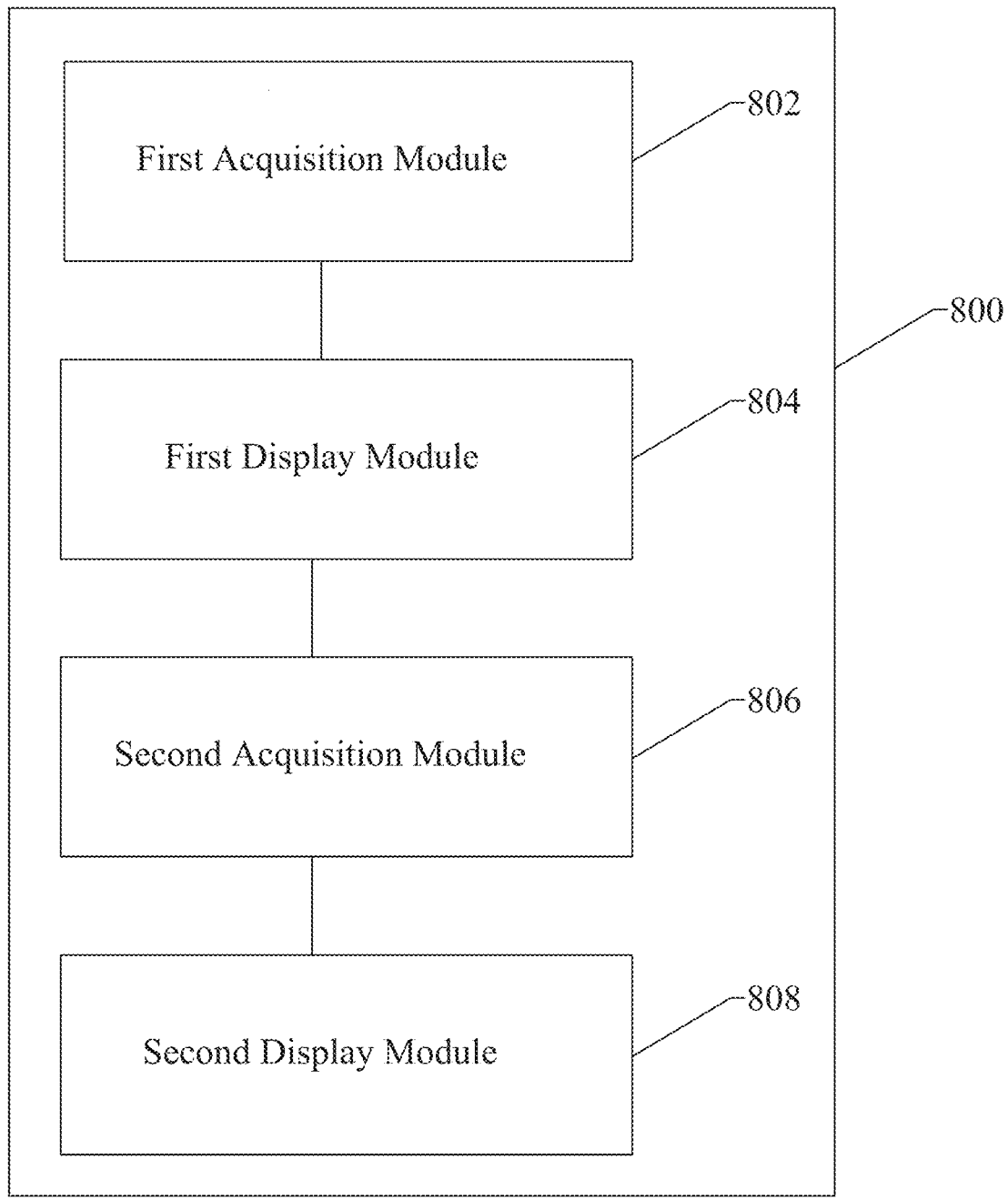
FIG. 8 is a structural block diagram of an apparatus for displaying information of a motor according to one embodiment.

As shown in FIG. 8, an apparatus 800 for displaying information of a motor is provided. The apparatus 800 specifically includes a first acquisition module 802, a first display module 804, a second acquisition module 806, and a second display module 808. The first acquisition module 802 is configured for acquiring a target category identifier of a target motor. The first display module 804 is configured for determining a category parameter interface according to the target category identifier, and displaying the category parameter interface, wherein the category parameter interface displays a category parameter tag, and the category parameter tag is used to prompt a user to enter parameter information corresponding to the category parameter tag. The second acquisition module 806 is configured for acquiring the target parameter information entered by the user via the category parameter interface. The second display module 808 is configured for obtaining the target display information corresponding to the target category identifier according to the target parameter information, and displaying the target display information.

The apparatus for displaying information of a motor as described above first acquires the target category identifier of the target motor; then determines and displays the category parameter interface according to the target category identifier, wherein the category parameter interface displays the category parameter tag, and the category parameter tag is used to prompt the user to enter parameter information corresponding to the category parameter tag; then acquires the target parameter information entered by the user via the category parameter interface; and finally, obtains and displays the target display information corresponding to the target category identifier according to the target parameter information. It can be seen that, with the apparatus described above, the user can check various display information by selecting the target category identifier. In addition, after determining the target category of display information to be displayed, the user further enters the target parameter information, such that the outputted target display information is obtained in response to the user input, instead of the information pre-printed on the product specification. As different target display information may be outputted corresponding to different target parameter information, the displaying method disclosed herein can effectively stop printing fraud and make the finally displayed target display information more convincing.

In one embodiment, the target category identifier is a basic parameter category identifier; the target parameter information includes target excitation signal information; and the target display information includes basic parameters of the motor.

In one embodiment, the target excitation signal information comprises preset type target excitation signal information and designed type target excitation signal information. The category parameter interface also displays an excitation signal generating button. The apparatus further includes detecting module for detecting a state of the excitation signal generating button; a first determining module for determining that the target excitation signal information is the designed type target excitation signal information if it is detected that the excitation signal generating button is triggered; a second determining module for determining that the target excitation signal information is the preset type target excitation signal information if it is detected that the excitation signal generating button is not trigged.

In one embodiment, the target category identifier is a resonance frequency identifier; the resonance frequency identifier includes a sweep frequency type identifier and/or a residual vibration type identifier. If the resonance frequency identifier is the sweep frequency type identifier, the category parameter tag is a sweep frequency signal design tag which is used to prompt the user to enter basic parameters of a sweep frequency signal. The target parameter information includes the basic parameters of the sweep frequency signal that are used to generate a target sweep frequency signal. The target display information includes a frequency-swept resonance frequency obtained by exciting the target motor using the target sweep frequency signal. If the resonance frequency identifier is the residual vibration type identifier, the category parameter tag includes an excitation signal voltage design tag and a reference resonance frequency tag; the category parameter tag is used to prompt the user to enter a voltage design parameter for the excitation signal and a reference resonance frequency. The target parameter information includes the voltage design parameter and the reference resonance frequency. The voltage design parameter includes an initial voltage amplitude and a voltage amplitude interval, and the target display information includes a plurality of residual vibration type resonant frequencies determined according to the initial voltage amplitude and the voltage amplitude interval.

In one embodiment, the target category identifier is a model design excitation signal identifier; the target parameter information includes basic parameters of the motor, a motor model and basic parameters of the excitation signal; the target display information includes a simulated excitation signal waveform obtained according to the basic parameters of the motor, the motor model and basic parameters of the excitation signal.

In one embodiment, the target category identifier is a backstepping design excitation signal identifier; the target parameter information includes a noise-signal ratio, a preset excitation signal, a target vibration signal, a target maximum vibration quantity and a maximum length of the target excitation signal; and the target display information includes a target excitation signal waveform obtained according to the noise-signal ratio, the preset excitation signal, the target vibration signal, the target maximum vibration quantity and the maximum length of the target excitation signal.

In one embodiment, the target category identifier is a reference design excitation signal identifier; the target parameter information includes basic parameters of a reference motor, an excitation signal of the reference motor, basic parameters of a target motor and maximum voltage of the target excitation signal; and the target display information includes a target excitation signal waveform of the target motor determined according to the basic parameters of the reference motor, the excitation signal of the reference motor, the basic parameters of the target motor and the maximum voltage of the target excitation signal.

Figure 9:
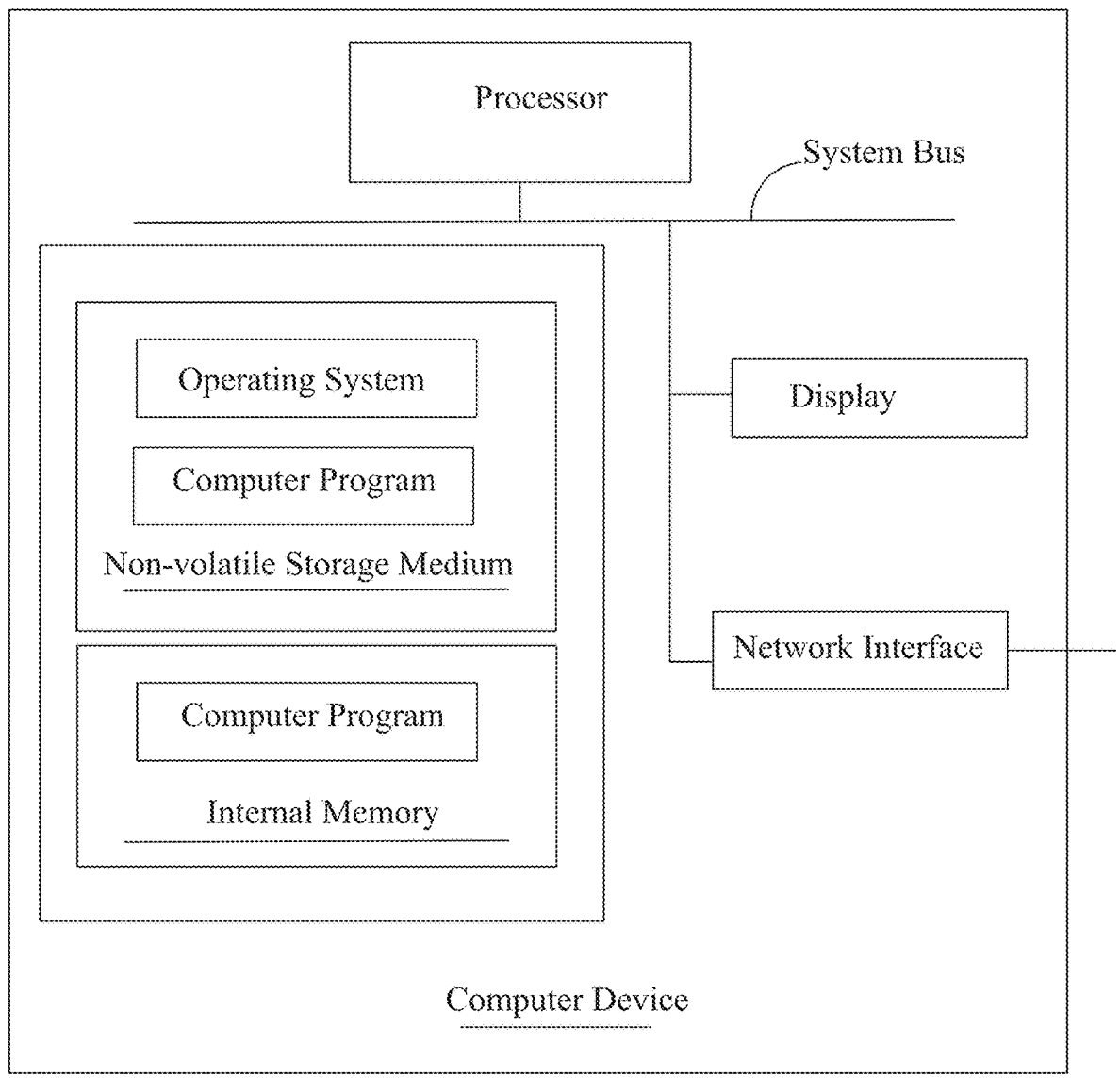
FIG. 9 is a structural block diagram of a computer device according to one embodiment.

FIG. 9 is an internal structural diagram of computer device according to one embodiment. In particular, the computer device can be a desktop computer or a server. As shown in FIG. 9, the computer device includes a processor, a memory and a network interface that are connected via a system bus. The memory includes a non-volatile storage medium and an internal memory. The non-volatile storage medium of the computer device stores an operating system thereon, and can also store a computer program thereon. When the computer program is executed by the processor, the processor can implement the method for displaying information of a motor disclosed herein. The internal memory can also store a computer program, and when the computer program is executed by the processor, the processor can implement the method for displaying information of a motor disclosed herein. Those skilled in the art will appreciate that the structure of FIG. 9 is illustrative rather than restrictive, and in practical application, the computer device can include more or less parts than those shown in the figures, a combination of some parts, or have parts arranged in different ways.

In one embodiment, the method for displaying information of a motor disclosed herein can be implemented in the form of a computer program, and the computer program can be executed by the computer device as shown in FIG. 9. The memory of the computer device can store various program modules for forming the apparatus for displaying information of a motor disclosed herein. The various program modules may include, for example, the first acquisition module 802, the first display module 804 and the second acquisition module 806.

As described above, the computer device includes the processor and the memory in communication with the processor, and the memory stores the computer program thereon. When the computer program is executed by the processor, the processor implements the following method steps: acquiring a target category identifier of a target motor; determining a category parameter interface according to the target category identifier, and displaying the category parameter interface, wherein the category parameter interface displays a category parameter tag which is used to prompt a user to enter parameter information corresponding to the category parameter tag; acquiring the target parameter information entered by the user via the category parameter interface; and obtaining the target display information corresponding to the target category identifier according to the target parameter information, and displaying the target display information.

In one embodiment, the target category identifier is a basic parameter category identifier; the target parameter information includes target excitation signal information; and the target display information includes basic parameters of the motor.

In one embodiment, the target excitation signal information comprises preset type target excitation signal information and designed type target excitation signal information. The category parameter interface also displays an excitation signal generating button. When the computer program is executed by the processor, the processor is further configured for detecting a state of the excitation signal generating button; determining that the target excitation signal information is the designed type target excitation signal information if it is detected that the excitation signal generating button is triggered; determining that the target excitation signal information is the preset type target excitation signal information if it is detected that the excitation signal generating button is not trigged.

In one embodiment, the target category identifier is a resonance frequency identifier; the resonance frequency identifier includes a sweep frequency type identifier and/or a residual vibration type identifier. If the resonance frequency identifier is the sweep frequency type identifier, the category parameter tag is a sweep frequency signal design tag which is used to prompt the user to enter basic parameters of a sweep frequency signal. The target parameter information includes the basic parameters of the sweep frequency signal that are used to generate a target sweep frequency signal. The target display information includes a frequency-swept resonance frequency obtained by exciting the target motor using the target sweep frequency signal. If the resonance frequency identifier is the residual vibration type identifier, the category parameter tag includes an excitation signal voltage design tag and a reference resonance frequency tag; the category parameter tag is used to prompt the user to enter a voltage design parameter for the excitation signal and a reference resonance frequency. The target parameter information includes the voltage design parameter and the reference resonance frequency. The voltage design parameter includes an initial voltage amplitude and a voltage amplitude interval, and the target display information includes a plurality of residual vibration type resonant frequencies determined according to the initial voltage amplitude and the voltage amplitude interval.

In one embodiment, the target category identifier is a model design excitation signal identifier; the target parameter information includes basic parameters of the motor, a motor model and basic parameters of the excitation signal; the target display information includes a simulated excitation signal waveform obtained according to the basic parameters of the motor, the motor model and basic parameters of the excitation signal.

In one embodiment, the target category identifier is a backstepping design excitation signal identifier; the target parameter information includes a noise-signal ratio, a preset excitation signal, a target vibration signal, a target maximum vibration quantity and a maximum length of the target excitation signal; and the target display information includes a target excitation signal waveform obtained according to the noise-signal ratio, the preset excitation signal, the target vibration signal, the target maximum vibration quantity and the maximum length of the target excitation signal.

In one embodiment, the target category identifier is a reference design excitation signal identifier; the target parameter information includes basic parameters of a reference motor, an excitation signal of the reference motor, basic parameters of a target motor and maximum voltage of the target excitation signal; and the target display information includes a target excitation signal waveform of the target motor determined according to the basic parameters of the reference motor, the excitation signal of the reference motor, the basic parameters of the target motor and the maximum voltage of the target excitation signal.

In one embodiment, a computer readable storage medium is provided which stores a computer program thereon. When the computer program is executed by the processor, the processor implements the following method steps: acquiring a target category identifier of a target motor; determining a category parameter interface according to the target category identifier, and displaying the category parameter interface, wherein the category parameter interface displays a category parameter tag that is used to prompt a user to enter parameter information corresponding to the category parameter tag; acquiring the target parameter information entered by the user via the category parameter interface; and obtaining the target display information corresponding to the target category identifier according to the target parameter information, and displaying the target display information.

In one embodiment, the target category identifier is a basic parameter category identifier; the target parameter information includes target excitation signal information; and the target display information includes basic parameters of the motor.

In one embodiment, the target excitation signal information includes preset type target excitation signal information and designed type target excitation signal information. The category parameter interface also displays an excitation signal generating button. When the computer program is executed by the processor, the processor is further configured for detecting a state of the excitation signal generating button; determining that the target excitation signal information is the designed type target excitation signal information if it is detected that the excitation signal generating button is triggered; determining that the target excitation signal information is the preset type target excitation signal information if it is detected that the excitation signal generating button is not triggered.

In one embodiment, the target category identifier is a resonance frequency identifier; the resonance frequency identifier includes a sweep frequency type identifier and/or a residual vibration type identifier. If the resonance frequency identifier is the sweep frequency type identifier, the category parameter tag is a sweep frequency signal design tag which is used to prompt the user to enter basic parameters of a sweep frequency signal. The target parameter information includes the basic parameters of the sweep frequency signal that are used to generate a target sweep frequency signal. The target display information includes a frequency-swept resonance frequency obtained by exciting the target motor using the target sweep frequency signal. If the resonance frequency identifier is the residual vibration type identifier, the category parameter tag includes an excitation signal voltage design tag and a reference resonance frequency tag; the category parameter tag is used to prompt the user to enter a voltage design parameter for the excitation signal and a reference resonance frequency. The target parameter information includes the voltage design parameter and the reference resonance frequency. The voltage design parameter includes an initial voltage amplitude and a voltage amplitude interval, and the target display information includes a plurality of residual vibration type resonant frequencies determined according to the initial voltage amplitude and the voltage amplitude interval.

In one embodiment, the target category identifier is a model design excitation signal identifier; the target parameter information includes basic parameters of the motor, a motor model and basic parameters of the excitation signal; the target display information includes a simulated excitation signal waveform obtained according to the basic parameters of the motor, the motor model and basic parameters of the excitation signal.

In one embodiment, the target category identifier is a backstepping design excitation signal identifier; the target parameter information includes a noise-signal ratio, a preset excitation signal, a target vibration signal, a target maximum vibration quantity and a maximum length of the target excitation signal; and the target display information includes a target excitation signal waveform obtained according to the noise-signal ratio, the preset excitation signal, the target vibration signal, the target maximum vibration quantity and the maximum length of the target excitation signal.

In one embodiment, the target category identifier is a reference design excitation signal identifier; the target parameter information includes basic parameters of a reference motor, an excitation signal of the reference motor, basic parameters of a target motor and maximum voltage of the target excitation signal; and the target display information includes a target excitation signal waveform of the target motor determined according to the basic parameters of the reference motor, the excitation signal of the reference motor, the basic parameters of the target motor and the maximum voltage of the target excitation signal.

It is noted that, the method for displaying information of a motor, the device for displaying information of a motor, the computer device and the computer readable storage medium belong to a general inventive concept, and share technical details in the embodiments thereof.

As will be appreciated by people skilled in the art, all or part of the steps of the method in the embodiments described above can be completed by hardware under the instructions of the computer program. The program can be stored in a non-volatile storage medium, and when the program is executed, the method of the embodiments described above can be implemented. Any reference to memory, storage, database or other medium used in all embodiments of the present disclosure involves non-volatile and/or volatile memories. Non-volatile memories can include read-only memory (ROM), programmable read-only memory (PROM), electrically programmable read-only memory (EPROM), electrically erasable programmable read-only memory (EEPROM), and flash memory. Volatile memories can include random access memory (RAM) or external cache memory. For purposes of illustration only, RAMS are available in various forms, such as static RAM (SRAM), dynamic RAM (DRAM), synchronous DRAM (SDRAM), double data rate SDRAM (DDRSDRAM), strengthened SDRAM (ESDRAM), synchlink DRAM (SLDRAM), rambus direct RAM (RDRAM), direct rambus dynamic RAM (DRDRAM), and rambus dynamic RAM (RDRAM), etc.

The features of the above embodiments can be combined in any suitable manner. For concise description, it is impossible to describe all possible combinations of the features of the above embodiments. However, as long as there is no contradiction in a combination of features of the present disclosure, that combination shall be considered as falling within the protective scope of the present disclosure.

Although the disclosure is described with reference to one or more embodiments, it will be apparent to those skilled in the art that various modifications and variations can be made to the disclosed structure and method without departing from the scope or spirit of the disclosure. In view of the foregoing, it is intended that the present disclosure cover modifications and variations of this invention provided they fall within the scope of the following claims and their equivalents.

What is claimed is:

1. A method for displaying information of a motor, comprising:
   acquiring a target category identifier of a target motor;
   determining a category parameter interface according to the target category identifier, and displaying the category parameter interface, wherein the category parameter interface displays a category parameter tag that prompts a user to enter parameter information corresponding to the category parameter tag;
acquiring target parameter information entered by the user via the category parameter interface;
obtaining target display information corresponding to the target category identifier according to the target parameter information, and displaying the target display information.

2. The method according to claim 1, wherein the target category identifier is a basic parameter category identifier, the target parameter information comprises target excitation signal information, and the target display information comprises basic parameters of the motor.

3. The method according to claim 2, wherein the target excitation signal information comprises preset type target excitation signal information and designed type target excitation signal information, the category parameter interface further displays an excitation signal generating button, and the method further comprises:
detecting a state of the excitation signal generating button;
determining that the target excitation signal information is the designed type target excitation signal information if it is detected that the excitation signal generating button is triggered; and
determining that the target excitation signal information is the preset type target excitation signal information if it is detected that the excitation signal generating button is not trigged.

4. The method according to claim 1, wherein the target category identifier is a resonance frequency identifier, and the resonance frequency identifier includes a sweep frequency type identifier and/or a residual vibration type identifier;
wherein, if the resonance frequency identifier is the sweep frequency type identifier, the category parameter tag is a sweep frequency signal design tag which is used to prompt the user to enter basic parameters of a sweep frequency signal, the target parameter information comprises the basic parameters of the sweep frequency signal that are used to generate a target sweep frequency signal according to the basic parameters of the sweep frequency signal, the target display information comprises a frequency-swept resonance frequency obtained by exciting the target motor using the target sweep frequency signal; and
wherein, if the resonance frequency identifier is the residual vibration type identifier, the category parameter tag is an excitation signal voltage design tag and a reference resonance frequency tag, the category parameter tag is used to prompt the user to enter a voltage design parameter for the excitation signal and a reference resonance frequency, the target parameter information comprises the voltage design parameter and the reference resonance frequency, the voltage design parameter comprises an initial voltage amplitude and a voltage amplitude interval, and the target display information comprises a plurality of residual vibration type resonant frequencies determined according to the initial voltage amplitude and the voltage amplitude interval.

5. The method according to claim 1, wherein the target category identifier is a model design excitation signal identifier, the target parameter information comprises basic parameters of the motor, a motor model and basic parameters of the excitation signal, the target display information comprises a simulated excitation signal waveform obtained according to the basic parameters of the motor, the motor model and basic parameters of the excitation signal.

6. The method according to claim 1, wherein the target category identifier is a backstepping design excitation signal identifier, the target parameter information comprises a noise-signal ratio, a preset excitation signal, a target vibration signal, a target maximum vibration quantity and a maximum length of the target excitation signal, and the target display information comprises a target excitation signal waveform obtained according to the noise-signal ratio, the preset excitation signal, the target vibration signal, the target maximum vibration quantity and the maximum length of the target excitation signal.

7. The method according to claim 1, wherein the target category identifier is a reference design excitation signal identifier, the target parameter information comprises basic parameters of a reference motor, an excitation signal of the reference motor, basic parameters of a target motor and maximum voltage of the target excitation signal, and the target display information comprises a target excitation signal waveform of the target motor determined according to the basic parameters of the reference motor, the excitation signal of the reference motor, the basic parameters of the target motor and the maximum voltage of the target excitation signal.

8. An apparatus for displaying information of a motor, comprising:
a first acquisition module for acquiring a target category identifier of a target motor;
a first display module for determining a category parameter interface according to the target category identifier, and displaying the category parameter interface, wherein the category parameter interface displays a category parameter tag that prompts a user to enter parameter information corresponding to the category parameter tag;
a second acquisition module for acquiring target parameter information entered by the user via the category parameter interface; and
a second display module for obtaining target display information corresponding to the target category identifier according to the target parameter information, and displaying the target display information.

9. A computer device comprising:
a processor; and
a memory in communication with the processor, the memory having a computer program stored thereon, the computer program is executable by the processor to implement a method for display information of a motor, the method comprising:
acquiring a target category identifier of a target motor;
determining a category parameter interface according to the target category identifier, and displaying the category parameter interface, wherein the category parameter interface displays a category parameter tag that prompts a user to enter parameter information corresponding to the category parameter tag;
acquiring target parameter information entered by the user via the category parameter interface; and
obtaining target display information corresponding to the target category identifier according to the target parameter information, and displaying the target display information.

10. The computer device according to claim 9, wherein the target category identifier is a basic parameter category identifier, the target parameter information comprises target excitation signal information, the target display information comprises basic parameters of the motor, the target excitation signal information comprises preset type target excitation signal information and designed type target excitation signal information, the category parameter interface further displays an excitation signal generating button, and the method further comprises:

detecting a state of the excitation signal generating button;

determining that the target excitation signal information is the designed type target excitation signal information if it is detected that the excitation signal generating button is triggered; and determining that the target excitation signal information is the preset type target excitation signal information if it is detected that the excitation signal generating button is not trigged.

11. The computer device according to claim 9, wherein the target category identifier is a resonance frequency identifier, and the resonance frequency identifier includes a sweep frequency type identifier and/or a residual vibration type identifier;

wherein, if the resonance frequency identifier is the sweep frequency type identifier, the category parameter tag is a sweep frequency signal design tag which is used to prompt the user to enter basic parameters of a sweep frequency signal, the target parameter information comprises the basic parameters of the sweep frequency signal that are used to generate a target sweep frequency signal according to the basic parameters of the sweep frequency signal, and the target display information comprises a frequency-swept resonance frequency obtained by exciting the target motor using the target sweep frequency signal;

wherein, if the resonance frequency identifier is the residual vibration type identifier, the category parameter tag is an excitation signal voltage design tag and a reference resonance frequency tag, the category parameter tag is used to prompt the user to enter a voltage design parameter for the excitation signal and a reference resonance frequency, the target parameter information comprises the voltage design parameter and the reference resonance frequency, the voltage design parameter comprises an initial voltage amplitude and a voltage amplitude interval, and the target display information comprises a plurality of residual vibration type resonant frequencies determined according to the initial voltage amplitude and the voltage amplitude interval.

12. The computer device according to claim 9, wherein the target category identifier is a model design excitation signal identifier, the target parameter information comprises basic parameters of the motor, a motor model and basic parameters of the excitation signal, and the target display information comprises a simulated excitation signal waveform obtained according to the basic parameters of the motor, the motor model and basic parameters of the excitation signal.

13. The computer device according to claim 9, wherein the target category identifier is a backstepping design excitation signal identifier, the target parameter information comprises a noise-signal ratio, a preset excitation signal, a target vibration signal, a target maximum vibration quantity and a maximum length of the target excitation signal, and the target display information comprises a target excitation signal waveform obtained according to the noise-signal ratio, the preset excitation signal, the target vibration signal, the target maximum vibration quantity and the maximum length of the target excitation signal.

14. The computer device according to claim 9, wherein the target category identifier is a reference design excitation signal identifier, the target parameter information comprises basic parameters of a reference motor, an excitation signal of the reference motor, basic parameters of a target motor and maximum voltage of the target excitation signal, and the target display information comprises a target excitation signal waveform of the target motor determined according to the basic parameters of the reference motor, the excitation signal of the reference motor, the basic parameters of the target motor and the maximum voltage of the target excitation signal.

\* \* \* \* \*